United States Patent [19]

Weisse

[11] 4,261,097

[45] Apr. 14, 1981

[54] METHOD FOR INSULATING SUPERCONDUCTORS IN A MAGNET WINDING

[75] Inventor: Hanns-Jörg Weisse, Erlangen, Fed. Rep. of Germany

[73] Assignee: Siemens Aktiengesellschaft, Berlin and Munich, Fed. Rep. of Germany

[21] Appl. No.: 65,628

[22] Filed: Aug. 10, 1979

[30] Foreign Application Priority Data

Aug. 25, 1978 [DE] Fed. Rep. of Germany ....... 2837199

[51] Int. Cl.[3] ............................................ H01L 39/24

[52] U.S. Cl. ........................................ 29/599; 29/605; 174/128 S; 242/7.03; 242/7.08; 427/62; 427/116

[58] Field of Search .................... 427/62, 116; 29/599, 29/605; 174/128 S, 110 PM; 242/7.03, 7.08

[56] References Cited

U.S. PATENT DOCUMENTS

| | | | |
|---|---|---|---|
| 3,749,811 | 7/1973 | Bogner et al. | 174/126 S |
| 3,792,528 | 2/1974 | Schober | 29/605 |
| 4,178,677 | 12/1979 | Weisse et al. | 29/605 |

OTHER PUBLICATIONS

Kuckuck et al. Proceedings of 6th Int. Conf. on Magnet Tech., Bratislava, Chech. Sep. 1977, published by ALFA Bratislava.

Hillman et al IEEE Transactions on Magnetics vol. MAG 15, No. 1 Jan. 1979.

*Primary Examiner*—Ronald H. Smith
*Assistant Examiner*—Richard Bueker
*Attorney, Agent, or Firm*—Kenyon & Kenyon

[57] ABSTRACT

A method for insulating superconductors in a magnet winding, in which any sizing and/or binders containing organic substances deposited on heat-resistant insulation used in the winding is first completely removed prior to an in-situ anneal, and at least a portion of the insulation is then provided with a special protective material. The magnet winding is then built up. The protective material is removed from the magnet winding, prior to the anneal, leaving no residue. In this way, formation of graphite from organic substances and consequent impairment of the insulation is avoided.

15 Claims, No Drawings

METHOD FOR INSULATING SUPERCONDUCTORS IN A MAGNET WINDING

BACKGROUND OF THE INVENTION

1. Field of the Invention

This invention relates to a method for insulating superconductors in a magnet winding, in which sizing and/or binders which contain organic substances and are deposited on heat resistant insulators, are removed prior to an in-situ anneal of intermediate conductor products provided for forming the superconductive properties of the conductors.

2. Discussion of the Prior Art

Superconductive intermetallic compounds of the type $A_3B$ having an A15 crystal structue, such as $Nb_3Sn$ or $V_3Ga$, have good properties of superconduction and are distinguished by high critical values. Conductors using these materials are therefore especially well suited for use in superconcduting magnet coils for generating strong magnetic fields. In addition to these binary compounds, ternary compounds, such as niobium aluminum germanium $Nb_3Al_{0.8}Ge_{0.2}$, are of particular interest for use as conductors in such magnets.

However, these intermetallic compounds are generally very brittle, so that their manufacture in a form suitable for magnet coils presents difficulties. Special processes have, therefore, been developed, by which superconductors having the A15 crystal structure can be fabricated in the form of long wires or ribbons. In these processes, which make possible, in particular, the fabrication of so-called multicore conductors, a first component, which is a dectile element in wire form of the intermetallic compound to be manufactured, is generally surrounded by cladding which consists of a ductile carrier metal and an alloy containing the other elements of the compound. For instance, a wire of niobium or vanadium is surrounded with cladding of a copper-tin bronze or a copper-gallium bronze. A multiplicity of such wires can also be embedded in a matrix of the alloy. The assembly of these two componets thus provided is then subjected to a cross-section reducing treatment and a long, wire-like structure is obtained, such as is needed for coils, without the occurrence of reactions which would embrittle the conductor. After the cross-section is reduced, the intermediate super-conductor product, consisting of one or several wire cores and the surrounding matrix material, is then subjected to an annealing treatment to form the desired superconductive compound, having an A15 crystal structure, by a reaction of the core material with the other element of the compound which is contained in the surrounding matrix. The element contained in the matrix thus is diffused into the core material, forming the compound (See British Patent No. 1,280,583).

Superconducting magnet coils using such superconductors are generally made by two different methods. In the first method, which is also known as the "react first-then wind" method, the intermediate conductor product of the superconductor to be manufactured is wound on a temporary coil form and is then subjected to the annealing treatment required for forming the desired superconductive compound. Subsequently, the superconductor made in this manner is unwound from the temporary coil form and can be processed further. The danger xists, especially when winding magnet windings, that the brittle intermetallic compounds of the conductors may be damaged, due to excessive deformation of the conductor, and that their superconduction properties would be impaired accordingly.

This danger does not exist with the second method of manufacturing the superconductive compound from the intermedite conductor product. In this method, which is called "wind-and-react" technique, the coil form of the magnet to be provided with the winding is first wound with not-yet-fully-reacted intermediate conductor product, and then the entire magnet, wound in this manner, is subjected to the diffusion anneal. This anneal is also called "in-situ" anneal. With this procedure, all difficulties of processing a brittle conductor material are avoided. It is also possible, in this manner, to fabricate coils having small inside diameters using relatively heavy conductors. However, with this method, all materials must withstand the high temperatures required for the diffusion anneal, which, for instance, in the case of niobium-tin, may be in the range of 700° C., for several hours.

Because of these requirements, almost the only insulating materials which can serve for insulating the turns and layers of the magnet winding are ceramics, glass, or quartz, in the form of filaments, fabrics or nonwoven fabrics. So that these, generally very brittle, insulating materials can be handled at all, so-called sizings and/or special binders are applied to them during their manufacture, to increase their notch impact strength and cohesion.

Sizing for fibers of the insulating materials mentioned may consist of an adhesion or film-forming agent, a lubricant and a wetting agent. Optionally, adhesion additives can be provided. These sizings contain, for instance, starch, dextrin or polyvinyl acetate (PVAC) as the adhesion and film-forming agent, and, as a rule, vegatable fats or oils as lubricants, and surface-active substances as wetting agents. Binders for fabrics of the insulating materials mentioned generally contain organic substances of the varnish or wax type. Such binders are, for instance, polyurethane or polyvinylbutyral.

The intermediate conductor products are generally braided or wrapped with glass or quartz filaments. In order to increase the resistance of such insulation against mechanical stresses, the insulation so prepared is generally also impregnated with a binder of the varnish or wax type. Even so, simple coverings do not provide sufficient security against shorts between turns. Therefore, multiple coverings or braids are provided which, however, result in a substantial increase in thickness and therefore, especially in the case of thin conductors, result in a corresponding decrease of the turns density in the winding. Because of the higher induced voltage between layer of a winding and for reasons of winding technique, fiberglass layer insulation is usually inserted, in addition.

In order to drive out the organic components in the winding, which stem from the sizing and the binders, the magnet windings are generally subjected to a purification anneal at temperatures of between 240° C. and 400° C., for instance, prior to the diffusion anneal of the intermediate conductor products. Carried out in a vacuum or in air, loss of more volatile components of the interim conductor product, such as tin, can occur here which decreases the current-carrying capacity of the subsequently annealed superconductor. In addition, oxides form on the matrix material, which diffuse at higher temperatures, for instance, above 700° C., into the glass material, and lead to complete embrittlement as well as to a decrease of the melting point of the glass. There is also the danger of a mechanical destruction of the insulation. If, on the other hand, the purification anneal is carried out in a protective gas such as argon, then the organic substances are only partially driven out of the winding; the rest is decomposed in the subsequent diffusion anneal to form graphite. This impairs the insulation and can result in short circuits in the winding.

It is therefore an object of the present invention to provide a method for insulating superconductors of a magnet winding to be annealed in situ, in which these dangers do not occur.

SUMMARY OF THE INVENTION

According to the present invention, this problem is solved, in a method for the purpose mentioned above, by providing for complete removal of the sizing and/or the binders from the insulators and instead, and by providing at least part of the insulators with a protective material of predetermined composition. The magnet winding having the intermediate conductor products and the insulators is then built up and, subsequently, the protective material is removed from the magnet winding before the in-situ anneal, without leaving residue.

The advantages of this method are, in particular, that, with a suitable choice of protective material, the formation of graphite from organic substances in the sizing and binders in the in-situ anneal and, thereby, an impairment of the insulation, is practically impossible.

According to another aspect of the method of the invention, insulating parts are provided for the turns and for isolating the layers and, after the sizing and/or the binders are removed, only the parts serving for layer insulation remain provided with protective material. In particular, glass ceramic or quartz filaments can be provided as insulating elements for the turns, being arranged parallel to the intermediate conductor products. The loss of strength of the glass, ceramic or quartz filaments which accompanies the desizing process is only of secondary importance, since the parallel-arranged quartz ceramic of glass filaments are stressed very little mechanically. In this manner, the parts for the turns insulation are eliminated, from the start, as a cause of a possible impairment of the insulation.

It is, in addition, advantageous to use a protective material with a pigment additive. In this way, the complete removal, by means of a solvent, of the protective material from the wound, but not yet annealed, magnet coil can be ascertained visually.

DETAILED DESCRIPTION OF THE INVENTION

To explain the invention and its further embodiments in greater detail, reference is made to the following illustrative embodiment.

To manufacture magnets with superconductors of the A15-type, such as the intermetallic compound $Nb_3Sn$, a start is made from an intermediate conductor product such as is described in British Patent No. 1,280,583. To make this intermediate conductor product, a niobium wire is first surrounded with a cladding of copper-tin bronze. A multiplicity of such wires can also be embedded in a matrix of the bronze. This assembly is subjected to a cross-section-reducing treatment. Thereby a wire is obtained, as the intermediate conductor product, which is sufficiently ductile.

This intermediate conductor product, in wire form, is then wound with a glass filament, the thickness of which corresponds to the thickness of the intermediate conductor product, onto the coil form of the magnet winding. In order to inhibit the formation of graphite during a subsequent reaction anneal, the glass filament is first desized, thermally, by annealing it in air at about 500° C. for about 30 minutes. Loss of strength in the glass filament, accompanying this, is a secondary importance, since the glass filament, which is placed parallel to the intermediate conductor product, is hardly stressed at all mechanically. In addition, such breaks in the glass filament as might occur can easily be repaired without loss of insulating character by simply placing such filaments side by side.

The advantage of this kind of turns insulation is, that braiding or covering and, thereby, an additional operation, can be dispensed with. Furthermore, the application of binder is eliminated as a source for formation of graphite in the winding during a later annealing process. In addition, favorable winding densities are achieved with the glass filament technique, especially if the conductors are shaped.

To match the superconductors to the current, matching can be achieved, in addition to the known methods of matching using different conductor cross-sections or conductors of different current carrying capacity, by connecting several conductors of the same or of different type in parallel. In this case, the intermediate conductor products can be placed side by side in the winding without insulation, with insulation then being required only for multiple turns. In this manner, the side ratios of the conductors can be increased, in addition to current matching, without impairing the current carrying capacity of the conductors due to anisotropic effect. At the same time, a favorable winding density is achieved.

In addition to insulation for the individual turns, insulation is required for the layers in the magnet coil. Because of their relatively low embrittlement in annealing, it is advantageous to use quartz or glass fabrics which have first been desized either thermally or, also, by means of enzymes. Desizing by enzymes has, in particular, the advantage of less embrittlement of the quartz or glass. Even so, the notch sensitivity of the quartz or glass fabrics desized in this manner is still too high, for instance, for winding thin circular intermediate conductor products of less than 0.9 mm on the magnet coil form without the danger of an insulation defect. According to the invention, the stability of the fabric is increased substantially by impregnating the fabric with a small amount of suitable varnish or wax. Suitable varnishes are, for instance, those which coat the quartz with a protective film and can subsequently be removed, without leaving residue, by a solvent or by a thermal treatment. As the impregnant, a solution can advantageously be provided which contains 5 to 20 g of a polyvinylbutyral (for instance, Farbwerke Hoechst AG, Frankfurt-Hoechst: Mowital B 60 H) per liter of acetone. By adding a pigment (for instance, E. Merck, Darmstadt: Victoria Blue 4R), the impregnation and later extraction can be checked easily. The desized fabric is then pulled through a solution and is subsequently dried, for instance, in air. After a few minutes, quartz fabrics, so-treated, are dimensionally stable and are no longer penetrated by conductors as small as 0.4 mm in diameter.

The completed coil assembly having the intermediate conductor product and the parallel, desized filaments, as well as the prepared quartz fabrics is then wrapped with several layers of a plastic film (Farbwerke Hoechst: Hostaphan) and temporarily bandaged, liquid-tight, with, for instance, a self-welding wrapping tape. Thereupon, the extraction of the impregnant is performed by means of a solvent. Suitable solvents for the impregnant mentioned are, for instance, ketones such as acetone, alcohols such as methanol, or ether such as methyl glycol. Washing out is greatly facilitated by means of a special coil form design of the type disclosed in German Offenlegungsschrift 27 09 300. This coil form has an integrated inlet and outlet system for moldless pressure impregnation. Using it, the solvent must be fed in, with the coil form standing at an angle or vertical, only through a lower hose nozzle and dischared through an upper hose nozzle. With special extraction apparatus, the washing-out process for the impregnant can advantageously be carried out continuously. The extraction is finished when the discharged solvent no longer contains pigment additive, i.e., if it leaves the coil colorless. The washing-out process may take, for instance, 10 to 15 hours.

Subsequently, the coil is dried, for instance, in vacuum or in a gas stream. After removing the temporary bandage, the reaction anneal, in which the niobium of the wire cores is reacted with the tin from the bronze by diffusion into the intermetallic compound $Nb_3Sn$, can then be performed. Formation of graphite in the winding and, therefore, impairment of the insulation, is impossible, because all organic components of the impregnant of the quartz fabric have been washed out by the preceding washing process and the glass filaments, now completely desized, had been applied to the coil form together with the intermediate conductor product prior to desizing.

Finally, the coil can be impregnated. As impregnant, low-molecular polyethylenes having molecular weights of between 1000 and 8000 can advantageously be used. These polyethylenes have sufficiently high solidification temperatures, between 100° C. and 120° C., are relatively firm mechanically at room temperature, and do not impair the winding behavior of the coils. At processing temperatures between 120° C. and 160° C., their viscosities are between about 0.03 and 3 Pas, low enough for vacuum impregnation of tightly wound magnets.

In the above example, it was assumed that the protective material for the insulating fabrics is completely removed by washing out with a suitable solvent. If special protective materials are used which contain organic substances which can be decomposed easily and completely into low-molecular, low-boiling components, a thermal treatment for driving out these materials from the winding may optionally be provided.

What is claimed is:

1. In a method of manufacturing an insulated superconducting magnet winding which includes the steps of:

(a) winding intermediate conductor products of superconductors, along with heat-resistant insulators which have had a sizing agent and/or special binders applied to them during their manufacture to increase their notch impact strength and cohesion, said sizings and binders containing organic substances, on a winding coil;

(b) treating said insulators to remove said sizing and/or binders; and (c) performing an in-situ anneal for forming superconductive conductors from said intermediate conductor products, the improvement comprising;

(d) completely removing any sizing agents and binders from the insulators prior to winding said insulators;

(e) impregnating at least some of said insulators with a protective film capable of being subsequently removed without leaving a residue; and (f) after the required magnet winding has been built up by sufficient turns of said intermediate conductor products, along with their associated insulators, removing said protective film from said insulators, in a manner such as to leave no residue, prior to carrying out said in-situ anneal.

2. The method of claim 1, in which the insulators include parts for insulating the turns and parts for insulating the layers, and only the parts for insulating the layers are provided with protective material after the sizing and/or the binders are removed.

3. The method of claim 2, in which the parts for insulating the turns are made of glass, ceramic or quartz filaments.

4. The method of claim 3, in which the parts for insulting the turns are arranged parallel to the intermediate conductor products.

5. The method of one of claims 2 to 4, in which the parts for insulating the layers are made of a glass or quartz fabric.

6. The method of claim 1 in which thermal treatment is used for removing any sizing or binder.

7. The method of claim 1 in which an enzyme treatment is used for removing any sizing or binders from the insulators.

8. The method according to one of claims 6 or 7, in which the insulators freed of any sizing or binder, are impregnated, at least in part, with a protective material.

9. The method of claim 1 in which the protective material is an impregnant.

10. The method of claim 9 in which the impregnant is a solution of polyvinylburyral in acetone.

11. The method of one of claims 9 to 10, in which the impregnant contains a pigment additive.

12. The method of claim 11, in which the step of removing the protective material from the magnet winding, is by dissolution in acetone or methanol, without leaving residue.

13. The method according to one of claims 1 to 4, 6, 7, 9 and 10 in which the step of removing the protective material from the magnet winding comprises a thermal treatment.

14. In the method according to one of the claims 1 to 4, 6, 9 and 10 the further improvement comprising the steps of annealing the magnet winding in-situ and then impregnating it.

15. In the method according to claim 14, the further improvement comprising the impregnant being a low-molecular polyethylene.

* * * * *